(12) United States Patent
Greim

(10) Patent No.: US 7,268,550 B2
(45) Date of Patent: Sep. 11, 2007

(54) ANTENNA ELEMENT AND ANTENNA ARRANGEMENT FOR MAGNETIC RESONANCE APPLICATIONS

(75) Inventor: Helmut Greim, Adelsdorf (DE)

(73) Assignee: Siemens Aktiengesellschaft, Munich (DE)

( * ) Notice: Subject to any disclaimer, the term of this patent is extended or adjusted under 35 U.S.C. 154(b) by 268 days.

(21) Appl. No.: 10/822,383

(22) Filed: Apr. 12, 2004

(65) Prior Publication Data

US 2004/0257073 A1   Dec. 23, 2004

(30) Foreign Application Priority Data

Apr. 10, 2003   (DE) ............................... 103 16 557

(51) Int. Cl.
*G01V 3/00* (2006.01)
(52) U.S. Cl. ...................................... 324/318; 324/322
(58) Field of Classification Search ................. None
See application file for complete search history.

(56) References Cited

U.S. PATENT DOCUMENTS

| | | | | |
|---|---|---|---|---|
| 2,764,742 A * | 9/1956 | Cady et al. | ................. | 333/221 |
| 2,973,471 A * | 2/1961 | Armistead et al. | .......... | 324/303 |
| 3,103,623 A * | 9/1963 | Greenwood, Jr. | .......... | 324/302 |
| 3,278,868 A * | 10/1966 | Kach | ........................ | 333/231 |
| 3,434,043 A * | 3/1969 | Nelson | ....................... | 324/310 |
| 4,620,155 A * | 10/1986 | Edelstein | .................... | 324/322 |
| 5,194,811 A * | 3/1993 | Murphy-Boesch et al. | . | 324/322 |
| 5,202,635 A * | 4/1993 | Srinivasan et al. | ......... | 324/322 |
| 5,666,055 A * | 9/1997 | Jones et al. | ................. | 324/318 |
| 6,040,697 A * | 3/2000 | Misic | ......................... | 324/318 |
| 6,177,797 B1 * | 1/2001 | Srinivasan | .................. | 324/318 |
| 6,291,994 B1 * | 9/2001 | Kim et al. | ................... | 324/300 |
| 6,396,273 B2 * | 5/2002 | Misic | ......................... | 324/318 |
| 6,633,161 B1 * | 10/2003 | Vaughan, Jr. | ............... | 324/318 |
| 6,714,013 B2 * | 3/2004 | Misic | ......................... | 324/318 |
| 6,842,003 B2 * | 1/2005 | Heid et al. | .................. | 324/318 |
| 6,850,064 B1 * | 2/2005 | Srinivasan | .................. | 324/318 |
| 7,012,430 B2 * | 3/2006 | Misic | ......................... | 324/318 |
| 7,106,063 B1 * | 9/2006 | Zens et al. | ................... | 324/318 |
| 2002/0145427 A1 | 10/2002 | Wong et al. | ................ | 324/318 |
| 2002/0167321 A1 * | 11/2002 | Misic | ......................... | 324/318 |
| 2003/0146750 A1 * | 8/2003 | Vaughan, Jr. | ............... | 324/318 |

(Continued)

FOREIGN PATENT DOCUMENTS

EP   0 290 187   11/1988

OTHER PUBLICATIONS

Translation of Japanese Application 09250490.

*Primary Examiner*—Brij Shrivastav
*Assistant Examiner*—Tiffany A. Fetzner
(74) *Attorney, Agent, or Firm*—Schiff Hardin LLP

(57) ABSTRACT

An antenna element for magnetic resonance applications has at least one sub-section that extends along a section axis and is adjacent to an auxiliary circuit. The antenna element has a coupling section and an auxiliary circuit section that is inductively coupled to the sub-section via the coupling section. The auxiliary circuit section extends parallel to the sub-section at a distance from the section axis. The auxiliary circuit has controllable tuning elements therein. Depending on their control state, a radio-frequency excitation current flowing in the sub-section causes, at respectively different times, each of a leading auxiliary current, or a lagging auxiliary current, or no auxiliary current to flow in the auxiliary current section.

17 Claims, 2 Drawing Sheets

U.S. PATENT DOCUMENTS

| | | | |
|---|---|---|---|
| 2004/0140808 A1* | 7/2004 | Vaughan, Jr. | 324/318 |
| 2004/0155657 A1* | 8/2004 | Misic | 324/318 |
| 2004/0257073 A1* | 12/2004 | Greim | 324/300 |
| 2005/0062472 A1* | 3/2005 | Bottomley | 324/317 |
| 2005/0099179 A1* | 5/2005 | Monski et al. | 324/318 |
| 2006/0033501 A1* | 2/2006 | Vaughan, Jr. | 324/322 |
| 2007/0007964 A1* | 1/2007 | Vaughan, Jr. | 324/322 |
| 2007/0066885 A1* | 3/2007 | Vaughan | 600/411 |

* cited by examiner

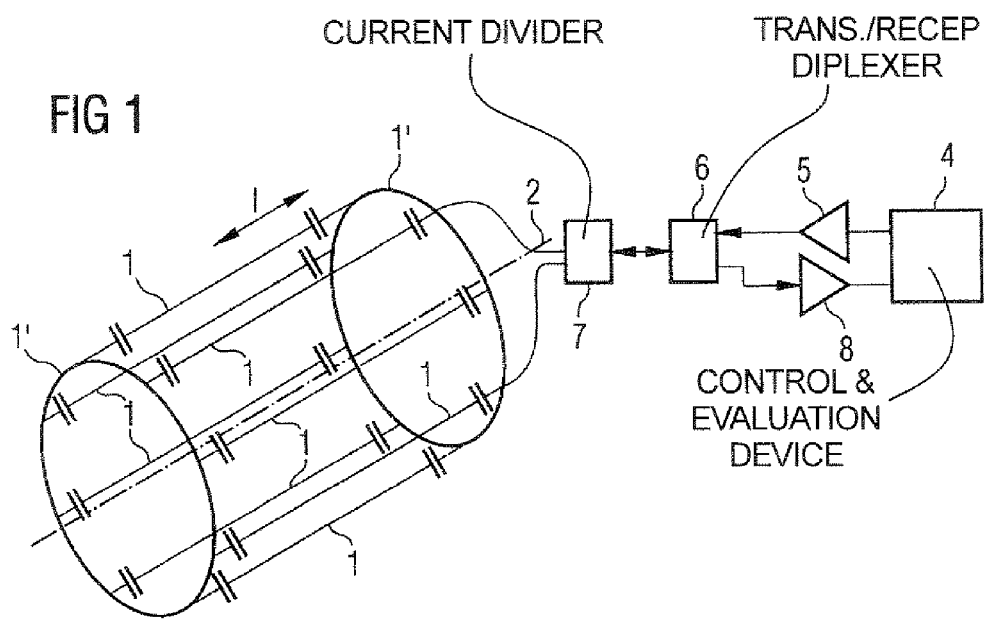
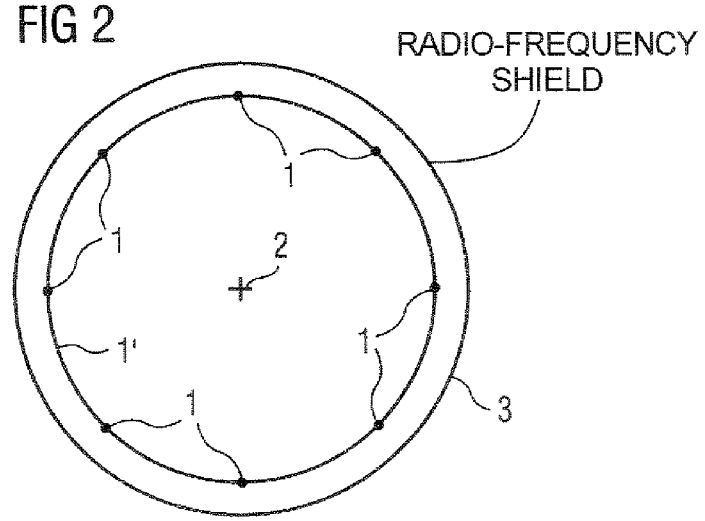

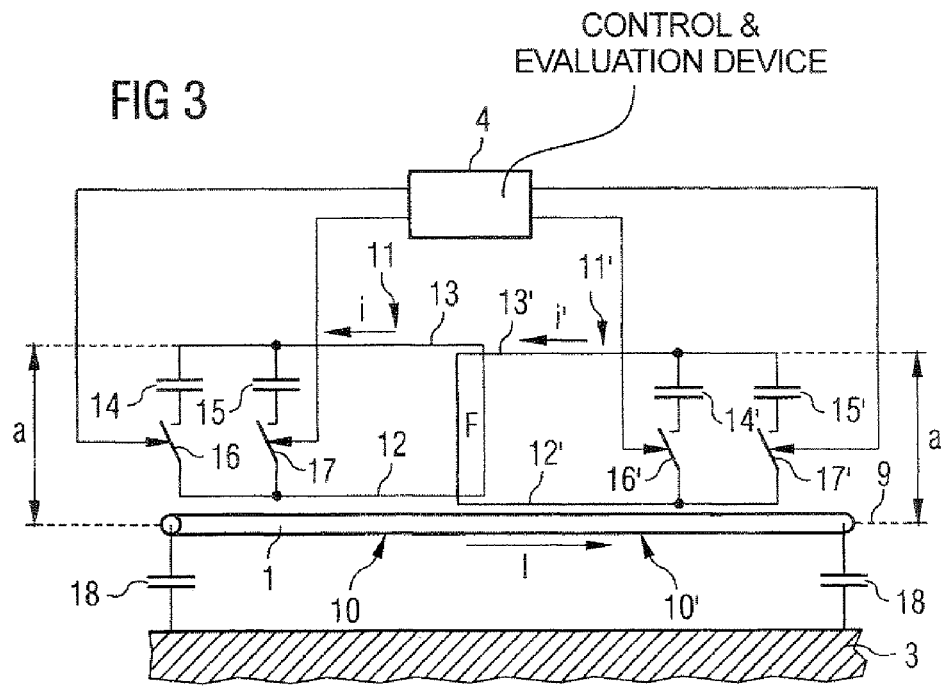
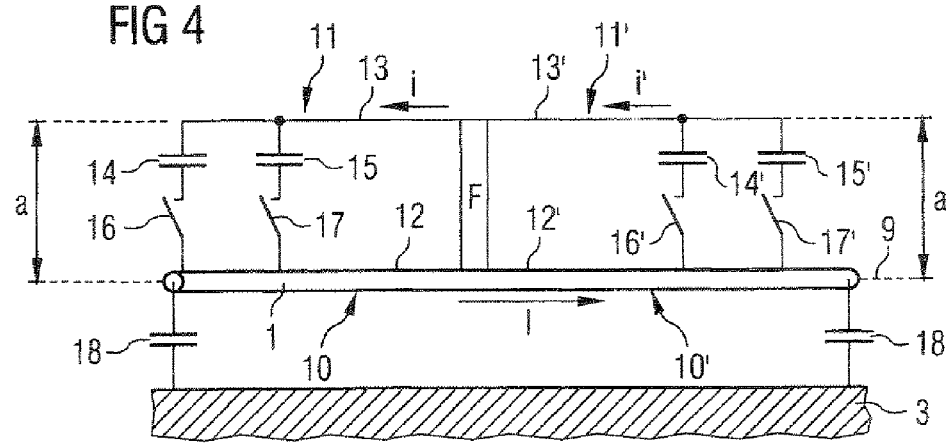

ANTENNA ELEMENT AND ANTENNA ARRANGEMENT FOR MAGNETIC RESONANCE APPLICATIONS

BACKGROUND OF THE INVENTION

1. Field of the Invention

The present invention concerns an antenna element for magnetic resonance applications of the type having a sub-section extending along a section axis. The present invention also concerns an antenna arrangement for magnetic resonance applications with a number of such antenna elements parallel to one another.

2. Description of the Prior Art

Antenna elements for magnetic resonance applications and corresponding antenna arrangements are generally known. In particular, the antenna elements can be fashioned as antenna rods of a birdcage resonator or as axially proceeding parts of a saddle coil.

In magnetic resonance applications, radio-frequency coils (resonators) are used for the excitation and the reception of radio-frequency alternating magnetic fields. In addition to a homogenous static magnetic field, an optimally homogenous radio-frequency field is also required for imaging. For example, cylindrical radio-frequency coils (birdcage resonators, saddle coils) exhibit a very homogenous radio-frequency profile.

Non-uniform loading of the radio-frequency coils, electrical shielding and dielectric resonance in the examination subject can lead to different excitations of the magnetic resonances. Such different excitations lead to effects known as shadowing effects (shadows) in the generated images.

For high-resolution exposures, it is therefore not sufficient to keep the current distribution on the antenna elements of the radio-frequency coil (or the antenna arrangement) constant. Rather, it can be necessary to individually adjust the current distribution, in particular dependent on the examination subject.

SUMMARY OF THE INVENTION

An object of the present invention is to provide an antenna element in which the current distribution can be adjusted along the section axis.

This object is achieved by an antenna element having a sub-section extending along a section axis, wherein a first auxiliary circuit is arranged adjacent to the first sub-section, the first auxiliary circuit having a coupling section and an auxiliary circuit section, and being inductively coupled to the first sub-section via the coupling section, with the auxiliary circuit section proceeding parallel to the first sub-section at a distance from the section axis. The first auxiliary circuit has controllable tuning elements therein and depending on the control state of the tuning elements, a radio-frequency excitation current flowing in the first sub-section causes an auxiliary current in the auxiliary circuit section leading the excitation current, an auxiliary current in the auxiliary circuit section lagging the excitation current, or no auxiliary current.

The coupling section alternatively can be a component of the sub-section or an element different from the sub-section. In the first case, a simpler, more compact and more cost-effective assembly of the antenna element results, in the second case less feedback of the current in the antenna element occurs.

In the minimum case, it can be sufficient when the antenna element has a single auxiliary circuit. Preferably, however, it has a second sub-section, axially offset with regard to the first sub-section, with a second auxiliary circuit adjacent thereto. The second auxiliary circuit has a coupling section and an auxiliary circuit section. The second auxiliary circuit is inductively coupled to the second sub-section via the coupling section, and the auxiliary circuit section proceeds parallel to the second sub-section, at a distance from the section axis. The second auxiliary circuit has controllable tuning elements therein, and depending on the control state of the tuning elements, a radio-frequency excitation current flowing in the second sub-section causes an auxiliary current in the auxiliary circuit section leading the excitation current, an auxiliary current in the auxiliary circuit section lagging the excitation current, or no auxiliary current.

Actually, normally more than two sub-sections are each arranged adjacent to their own auxiliary circuit.

The auxiliary circuits preferably are inductively decoupled from one another. This can be achieved, for example, by the auxiliary circuits having an overlap region.

The auxiliary circuits furthermore are preferably controllable independently of one another. A flexible operation of the antenna element thereby results.

Typical antenna arrangements for magnetic resonance applications employ a number of antenna elements disposed parallel to one another. In the case of the present invention, the elements individually are fashioned as described above. The antenna elements can be fashioned rod-shaped and arranged around an arrangement axis.

The antenna arrangement can form a saddle coil, but the antenna elements preferably are coupled with one another at their ends by ferrules (rings), i.e. the antenna arrangement is fashioned as a birdcage resonator. This embodiment is often used, particularly if the antenna arrangement has dimensions for use as a whole-body coil. Coupling of the antenna elements to a radio-frequency shield surrounding the antenna arrangement is also possible.

DESCRIPTION OF THE DRAWINGS

FIG. 1 shows an inventive antenna arrangement in perspective representation.

FIG. 2 shows the antenna arrangement of FIG. 1 in cross-section.

FIG. 3 shows an antenna element for use in the inventive antenna.

FIG. 4 shows an alternative embodiment of such an antenna element.

DESCRIPTION OF THE PREFERRED EMBODIMENTS

As shown in FIGS. 1 and 2, an antenna arrangement for magnetic resonance applications has a number—in the present case eight—of identically fashioned antenna elements 1. The antenna elements 1 are rod-shaped and arranged around an arrangement axis. In the present case, they are coupled with one another at their ends by ferrules 1'. The antenna elements 1 run parallel to the arrangement axis 2, and thus are also parallel to one another. The antenna arrangement thus forms a birdcage resonator.

The antenna elements 1 are—see FIG. 2—surrounded by a radio-frequency shield 3. This is particularly desirable when the antenna arrangement is fashioned as a whole-body antenna of a magnetic resonance system, as in the present case.

A current can be fed into the antenna arrangement from a control and evaluation device 4 via a power amplifier 5, a transmission/reception diplexer 6, and a current divider 7. A 90° phase shift ensues via the current divider 7 in one of the in-feed branches. The antenna arrangement therefore is excited such that it generates a circularly polarized radio-frequency field. A subject (not shown)—for example a person—thus can be excited to magnetic resonance by this radio-frequency field.

Excited magnetic resonances signals can also be received (detected) by the antenna arrangement. A received magnetic resonance signal can then be supplied to the control and evaluation device 4 via the current divider 7 (that acts as a combiner in the reception mode), the transmission/reception diplexer 6 and a pre-intensifier 8. It can be progressively evaluated by the control and evaluation device 4.

As shown in FIG. 3, a first auxiliary circuit 11 has a coupling section 12 and an auxiliary circuit section 13. A first auxiliary circuit 11 is inductively coupled to a first sub-section 10 via the coupling section 12. The auxiliary circuit section 13 of the first auxiliary circuit 11 proceeds parallel to the first sub-section 10 at a distance "a" from the section axis 9.

A radio-frequency current (called an excitation current I in the transmission mode) flows in the antenna elements 1 both in the case of transmission and in the case of reception.

As shown in FIG. 3, each antenna element 1 extends along a section axis 9. Each antenna element 1 has a first sub-section 10 and a second sub-section 10'. The sub-sections 10, 10' extend along the section axis 9, but they are axially offset relative to one another. Generally, more than two sub-sections 10, 10' axially offset relative to one another are present, for example four sub-sections 10, 10'.

Each sub-section 10, 10' is adjacent to its associated auxiliary circuit 11, 11'. The auxiliary circuits 11, 11' are identically fashioned and cooperate with the first and second sub-sections 10, 10' respectively. Due to this identical design and the identical operation, only the first auxiliary circuit 11 described in detail below. The embodiments with regard to the first auxiliary circuit 11 are also analogously applicable to the second auxiliary circuit 11' (and, as the case may be, also further auxiliary circuits).

As shown in FIG. 3, the first auxiliary circuit 11 has tuning elements 14, 15 that can be controlled by the control and evaluation device 4 independently of one another via switches 16, 17. The switches 16, 17 can be, for example, PIN diodes or relays.

When the switch 16 is closed and the switch 17 is open, the resonant frequency of the first auxiliary circuit 11 is below the frequency (which is the selected magnetic resonance frequency) of the excitation current I that flows in the antenna element 1. The excitation current I therefore causes an auxiliary current i in the first auxiliary circuit 11 (as well as in the corresponding auxiliary circuit section 13) that leads the excitation current I.

When, in reverse, the switch 16 is open and the switch 17 is closed, the resonant frequency of the first auxiliary circuit 11 is higher than the resonance frequency. In this case, via the excitation current I, an auxiliary current i is caused in the first auxiliary circuit 11 (and the associated auxiliary circuit section 13) that lags the excitation current I.

When both switches 16, 17 are open, the excitation current I can cause no auxiliary current i in the first auxiliary circuit 11.

The second auxiliary circuit 11', or more specifically switches 16', 17', can be controlled independently of the control state of the first auxiliary circuit 11, or more specifically switches 16, 17. The auxiliary circuits 11, 11' thus can be controlled independently of one another.

As shown in FIG. 3, the auxiliary circuits 11, 11' have an overlap region F. Due to this overlap region F, the auxiliary circuits 11, 11' are inductively decoupled from one another.

The design of the antenna element of FIG. 4 substantially corresponds to the design of the antenna element of FIG. 3. The single difference is that the coupling sections 12, 12' for the sub-sections 10, 10' are different elements in the antenna element 1 according to FIG. 3, while the coupling sections 12, 12' are components of the sub-sections 10, 10' in the representation according to FIG. 4. Also, for better clarity, in the representation in FIG. 4 the control and evaluation device 4 is not shown.

Thus, in the transmission mode, the fields caused by the individual antenna elements 1 can be locally influenced by control of the auxiliary circuits 11, 11'. In the reception mode the local sensitivity of the antenna elements 1 can be directed toward the field to be detected by control of the auxiliary circuits 11, 11'. The influence on the excitation current I flowing in the entire antenna element 1 remains negligibly small. The field emitted or acquired by the antenna element 1 in the region of the respective sub-section 10, 10' corresponds, however, with the entire current flowing in the respective sub-sections 10, 10' of the antenna element 1. Thus the excitation current I or the overlay of excitation current I and auxiliary current i or i' depends on control of the switches 16, 17, 16', 17'. Thus the total current (I or I+i or I+i') flowing locally in the respective sub-section 10, 10' of the antenna element 1 can be adjusted.

As shown in FIGS. 3 and 4, the antenna element 1 is coupled to the radio-frequency shield 3 via capacitors 18. This design represents an alternative to the coupling of the antenna elements 1 via the ferrules 1'.

A shadow effect in generated magnetic resonance images thus can be prevented by the inventively fashioned adjacent antenna elements. The conditions under which the individual auxiliary circuits 11, 11' are to be coupled to the sub-sections 10, 10', and thus which of the switches 16, 17, 16', 17' is to be closed, can be determined by simple tests, in connection with considerations of symmetry, as warranted.

Although modifications and changes may be suggested by those skilled in the art, it is the intention of the inventor to embody within the patent warranted hereon all changes and modifications as reasonably and properly come within the scope of his contribution to the art.

I claim as my invention:

1. An antenna element configured for magnetic resonance applications comprising:

an antenna element sub-section extending along a section axis;

an auxiliary circuit disposed adjacent to said antenna element sub-section, said auxiliary circuit comprising a coupling section and an auxiliary circuit section;

said auxiliary circuit being inductively coupled to said antenna element sub-section by said coupling section, and said auxiliary circuit section proceeding parallel to said antenna element sub-section at a distance from said section axis than said coupling section; and said auxiliary circuit comprising controllable tuning elements, connected between said auxiliary circuit section and said coupling section, having respective non-coinciding first, second and third control states, the respective control states being selectively controllable to cause a radio frequency excitation current distribution flowing in said antenna element sub-section along said section axis to produce an auxiliary current in said auxiliary current section that leads said excitation current when said tuning elements are in said first control state, and an auxiliary current in said auxiliary current section that lags said excitation, current when said tuning elements are in said second control state and no auxiliary current in said auxiliary circuit section when said tuning elements are in said third control state.

2. An antenna element as claimed in claim 1 wherein said coupling section is a component of said antenna element sub-section.

3. An antenna element as claimed in claim 1 wherein said coupling section is a different element from said antenna element sub-section.

4. An antenna element as claimed in claim 1 wherein said antenna element sub-section is a first antenna element sub-section, said auxiliary circuit is a first auxiliary circuit, said coupling section is a first coupling section, said auxiliary circuit section is a first auxiliary circuit section, and said controllable tuning elements are first controllable first tuning elements, and wherein said antenna element further comprises:
- a second antenna element sub-section axially offset from said first antenna element sub-section;
- a second auxiliary circuit adjacent to said second antenna element sub-section;
- said second auxiliary circuit comprising a second coupling section and a second auxiliary circuit section;
- said second auxiliary circuit being inductively coupled to said second sub-section by said second coupling section, and said second auxiliary circuit section proceeding parallel to said second antenna element sub-section at a larger distance from said section axis than said second coupling section; and
- said second auxiliary circuit comprising controllable second tuning elements, connected between said auxiliary circuit section and said coupling section, having respective non-coinciding first, second and third further control states, the respective further control states of said controllable second tuning elements being selectively controllable to cause a radio frequency excitation current flowing in the second antenna element sub-section to produce an auxiliary current in the second auxiliary circuit section that leads said excitation current in the second antenna element sub-section when said second tuning elements are in said first further control state, and an auxiliary current in the second auxiliary circuit section that lags the excitation current in the second antenna element sub-section when said second tuning elements are in said second further control state, and no auxiliary current in the second auxiliary circuit section when said second tuning elements are in said third further control state.

5. An antenna element as claimed in claim 4 wherein said first and second auxiliary circuits are inductively decoupled from each other.

6. An antenna element as claimed in claim 5 wherein said first and second auxiliary circuits have an overlapping region.

7. An antenna element as claimed in claim 4 wherein said second controllable tuning elements are selectively controllable independently of said first controllable tuning elements.

8. An antenna arrangement configured for magnetic resonance applications comprising:
- a plurality of antenna elements disposed parallel to each other, each of said antenna elements comprising a sub-section extending along a section axis;
- an auxiliary circuit disposed adjacent to said sub-section, said auxiliary circuit comprising a coupling section and an auxiliary circuit section, said auxiliary circuit being inductively coupled to said sub-section by said coupling section, and said auxiliary circuit section proceeding parallel to said sub-section at a larger distance from said section axis; than said coupling section and said auxiliary circuit comprising controllable tuning elements, connected between said auxiliary circuit section and second coupling section having non-coinciding first, second and third control states, the respective control states being selectively controllable to cause a radio frequency excitation distribution current flowing in said sub-section along said section axis to produce an auxiliary current in said auxiliary circuit section that leads said excitation current when said tuning elements are in said first control state, and an auxiliary current in said auxiliary circuit that lags said excitation current when said tuning, elements are in said second control state, and no auxiliary current in said auxiliary circuit section when said tuning elements are in said third control state.

9. An antenna arrangement as claimed in claim 8 wherein said coupling section is a component of said sub-section.

10. An antenna arrangement as claimed in claim 8 wherein said coupling section is a different element from said sub-section.

11. An antenna arrangement as claimed in claim 8 wherein said sub-section is a first sub-section, said auxiliary circuit is a first auxiliary circuit, said coupling section is a first coupling section, said auxiliary circuit section is a first auxiliary circuit section, and said controllable tuning elements are controllable first tuning elements, and wherein each of said antenna elements further comprises:
- a second sub-section axially offset from said first sub-section;
- a second auxiliary circuit adjacent to said second sub-section;
- said second auxiliary circuit comprising a second coupling section and a second auxiliary circuit section;
- said second auxiliary circuit being inductively coupled to said second sub-section by said second coupling section, and said second auxiliary circuit section proceeding parallel to said second sub-section at a distance from said section axis; and
- said second auxiliary circuit comprising controllable second tuning elements having respective non-coinciding first, second and third further control states, the respective further control states of said second controllable tuning elements being selectively controllable to cause a radio frequency excitation current flowing in the second sub-section to produce an auxiliary current in the second auxiliary circuit section that leads said excitation current in the second sub-section when said second tuning elements are in said first further control state, and an auxiliary current in the second auxiliary circuit section that lags the excitation current in the second antenna element sub-section when said second tuning elements are in said second further control state, and no auxiliary current in the second auxiliary circuit section when said second tuning elements are in said third further control state.

12. An antenna arrangement as claimed in claim 11 wherein said first and second auxiliary circuits are inductively decoupled from each other.

13. An antenna arrangement as claimed in claim 12 wherein said first and second auxiliary circuits have an overlapping region.

14. An antenna arrangement as claimed in claim 11 wherein said second controllable tuning elements are selectively controllable independently of said first controllable tuning elements.

15. An antenna arrangement as claimed in claim 8 wherein each of said antenna elements is rod-shaped, and wherein said antenna elements are disposed around an arrangement axis.

16. An antenna arrangement as claimed in claim 15 wherein each of said antenna elements has opposite ends, and wherein said antenna arrangement further comprises two ferrules respectively disposed at the opposite ends of the antenna elements coupling said antenna elements with each other.

17. An antenna arrangement as claimed in claim 15 wherein each of said antenna elements has opposite ends, and wherein said antenna arrangement comprises a radio-frequency shield surrounding said antenna elements, and a plurality of capacitors coupling the respective antenna elements to said radio-frequency shield at said opposite ends.

* * * * *